(12) United States Patent
Oyamada

(10) Patent No.: US 10,483,182 B2
(45) Date of Patent: Nov. 19, 2019

(54) INTERMEDIATE CONNECTOR, SEMICONDUCTOR DEVICE INCLUDING INTERMEDIATE CONNECTOR, AND METHOD OF MANUFACTURING INTERMEDIATE CONNECTOR

(71) Applicant: Noda Screen Co., Ltd., Aichi (JP)

(72) Inventor: Seisei Oyamada, Tokyo (JP)

(73) Assignee: NODA SCREEN CO., LTD., Aichi (JP)

( * ) Notice: Subject to any disclaimer, the term of this patent is extended or adjusted under 35 U.S.C. 154(b) by 0 days.

(21) Appl. No.: 16/091,155

(22) PCT Filed: May 24, 2016

(86) PCT No.: PCT/JP2016/065338
§ 371 (c)(1),
(2) Date: Oct. 4, 2018

(87) PCT Pub. No.: WO2017/203607
PCT Pub. Date: Nov. 30, 2017

(65) Prior Publication Data
US 2019/0131202 A1    May 2, 2019

(51) Int. Cl.
*H01L 23/02* (2006.01)
*H01L 23/32* (2006.01)
(Continued)

(52) U.S. Cl.
CPC .......... *H01L 23/32* (2013.01); *H01L 21/4853* (2013.01); *H01L 23/49827* (2013.01);
(Continued)

(58) Field of Classification Search
CPC ............... H01L 23/32; H01L 23/49827; H01L 21/4853; H01L 23/49838; H01L 23/647;
(Continued)

(56) References Cited

U.S. PATENT DOCUMENTS 5,272,600 A    12/1993 Carey
5,483,099 A    1/1996 Natarajan et al.
(Continued)

FOREIGN PATENT DOCUMENTS

JP    9-55535       2/1997
JP    2005-045150   2/2005
(Continued)

OTHER PUBLICATIONS

International Search Report dated Aug. 9, 2016 in International (PCT) Application No. PCT/JP2016/065338.

*Primary Examiner* — Vu A Vu
(74) *Attorney, Agent, or Firm* — Wenderoth, Lind & Ponack, L.L.P.

(57) ABSTRACT

An intermediate connector includes a power source bus bar as an elongated thin plate to be connected to each power source pad of a semiconductor integrated circuit, a ground bus bar as an elongated thin plate to be connected to each ground pad of the semiconductor integrated circuit, a thin film insulator layer formed between the power source bus bar and the ground bus bar, and a conductive path portion as an elongated thin plate including a plurality of conductive paths to be connected to each signal pad of the semiconductor integrated circuit. The power source bus bar, the ground bus bar, and the conductive path portion are arranged in parallel correspondingly to a parallel arrangement of a power source pad row, a ground pad row, and a signal pad row of the semiconductor integrated circuit.

6 Claims, 10 Drawing Sheets

(51) Int. Cl.
*H05K 1/02* (2006.01)
*H01L 21/48* (2006.01)
*H01L 23/498* (2006.01)
*H01L 23/64* (2006.01)
*H01L 23/00* (2006.01)

(52) U.S. Cl.
CPC ...... *H01L 23/49838* (2013.01); *H01L 23/647* (2013.01); *H01L 24/16* (2013.01); *H01L 24/81* (2013.01); *H05K 1/02* (2013.01); *H01L 24/13* (2013.01); *H01L 2224/13144* (2013.01); *H01L 2224/16* (2013.01); *H01L 2224/16227* (2013.01)

(58) Field of Classification Search
CPC ............ H01L 24/81; H01L 24/16; H01L 2224/16227; H01L 24/13; H01L 2224/13144; H01L 2224/16; H05K 1/02
USPC .......................................................... 257/668
See application file for complete search history.

(56) References Cited

U.S. PATENT DOCUMENTS

| | | | |
|---|---|---|---|
| 6,740,965 B2 * | 5/2004 | Hsu | H01L 23/49838 257/692 |
| 7,436,069 B2 | 10/2008 | Matsui | |
| 7,811,920 B2 | 10/2010 | Matsui | |
| 8,018,035 B2 * | 9/2011 | Tanaka | H01L 23/49838 257/662 |
| 8,786,099 B2 | 7/2014 | Fujii | |
| 8,836,138 B2 | 9/2014 | Fujii | |
| 9,076,786 B2 | 7/2015 | Sekine et al. | |
| 9,111,936 B2 * | 8/2015 | Law | H01L 23/481 |
| 9,153,549 B2 | 10/2015 | Oyamada et al. | |
| 9,295,154 B2 | 3/2016 | Shiroshita | |
| 9,583,431 B1 * | 2/2017 | Rahman | H01L 23/5226 |
| 2005/0016764 A1 | 1/2005 | Echigo et al. | |
| 2006/0118965 A1 | 6/2006 | Matsui | |
| 2008/0122080 A1 * | 5/2008 | Lu | H01L 24/14 257/737 |
| 2009/0075478 A1 | 3/2009 | Matsui | |
| 2013/0062754 A1 | 3/2013 | Fujii | |
| 2013/0062778 A1 | 3/2013 | Fujii | |
| 2014/0070368 A1 | 3/2014 | Oyamada et al. | |
| 2015/0000965 A1 | 1/2015 | Shiroshita | |
| 2015/0041990 A1 | 2/2015 | Sekine et al. | |

FOREIGN PATENT DOCUMENTS

| | | |
|---|---|---|
| JP | 2006-165025 | 6/2006 |
| JP | 2013-058710 | 3/2013 |
| JP | 2013-062296 | 4/2013 |
| JP | 2015-012112 | 1/2015 |
| JP | 2015-035483 | 2/2015 |
| WO | 2013/172060 | 11/2013 |

* cited by examiner

INTERMEDIATE CONNECTOR, SEMICONDUCTOR DEVICE INCLUDING INTERMEDIATE CONNECTOR, AND METHOD OF MANUFACTURING INTERMEDIATE CONNECTOR

TECHNICAL FIELD

The present invention relates to an intermediate connector, a semiconductor device including an intermediate connector, and a method of manufacturing an intermediate connector, and more specifically, to an intermediate connector that is provided between a semiconductor integrated circuit and a circuit board and electrically connects the semiconductor integrated circuit and the circuit board.

BACKGROUND ART

Conventionally, as an intermediate connector, or a so-called interposer, a technique disclosed in Patent Document 1 has been known, for example. In Patent Document 1, a multilayer wiring board as an intermediate connector is disclosed. With regard to the multilayer wiring board, the Patent Document 1 discloses a technique of forming a multilayer wiring board by laminating a plurality of unit wiring boards including an insulating layer, a wiring layer, and a via hole conductor.

RELATED ART DOCUMENT

Patent Document
Patent Document 1: Japanese Unexamined Patent Application Publication No. 2005-45150

Problem to be Solved by the Invention

However, in recent years, in an LSI (semiconductor integrated circuit) such as a server type CPU, a chip size of the LSI has reached 24×24 mm, which is the maximum diameter of a mask size of a stepper. Correspondingly, a pitch of an area array has been narrowed, and as a result, the number of pads has also steadily increased to, for example, as high as 200×200 (40000) pieces. Therefore, in order to cope with an LSI having this large number of pads with a conventional multilayer wiring board, it is necessary to increase the number of laminations. However, an increase of the number of laminations is accompanied with a presence of a larger number of relatively long vias that cannot control an impedance of a signal in a signal wiring layer in the lowermost stage that is distant from the LSI. It is concerned that this might result in a deterioration of a signal, in a high speed transmission. There is also a concern that, according to an increase of the number of laminations, a power source wiring layer positioned in an upper stage might have a larger number of openings for passing signals, and a larger number of openings for passing power sources having different potentials, and as a result, it might be impossible to maintain a function of a power plane as a power source wiring layer. Thus, there has been a demand for an intermediate connector that can cope with a semiconductor integrated circuit having a large number of pads, with a simple configuration.

DISCLOSURE OF THE PRESENT INVENTION

Thus, the present description provides an intermediate connector that can cope with a semiconductor integrated circuit having a large number of pads, with keeping a power source impedance low to a high frequency region, and a method of manufacturing the same.

Means for Solving the Problem

The intermediate connector disclosed in the present description is an intermediate connector that is provided between a semiconductor integrated circuit and a circuit board on which the semiconductor integrated circuit is mounted, and electrically connects the semiconductor integrated circuit and the circuit board. The semiconductor integrated circuit includes a bump mounting face on which a power source pad row including a plurality of power source pads, a ground pad row including a plurality of ground pads, and a signal pad row including a plurality of signal pads are arranged in parallel. The intermediate connector includes: a power source bus bar in a form of an elongated thin plate that has a length of at least a length of the power source pad row, and is to be connected to each of the power source pads of the power source pad row; a ground bus bar in a form of an elongated thin plate that has a length of at least a length of the ground pad row, and is to be connected to each of the ground pads of the ground pad row; a thin film insulator layer that is formed between the power source bus bar and the ground bus bar; and a conductive path portion in a form of an elongated thin plate that has a length of at least a length of the signal pad row, and includes a plurality of conductive paths to be connected to each of the signal pads of the signal pad row. The power source bus bar, the ground bus bar, and the conductive path portion are joined together in a parallel arrangement corresponding to the parallel arrangement of the power source pad row, the ground pad row, and a signal pad row, each of which being in a standing state such that a longitudinal direction of the thin plate is parallel to the bump mounting face of the semiconductor integrated circuit.

According to the present configuration, power and signals are supplied to a semiconductor integrated circuit in which the pad rows are arranged in parallel, by the bus bars each in a form of a thin plate, and the conductive path portion in a form of a thin plate. The power source bus bar, the ground bus bar, and the conductive path portion are arranged in parallel correspondingly to the parallel arrangement of the pads of the semiconductor integrated circuit, each in a standing state such that a longitudinal direction of the thin plate is parallel to the bump mounting face of the semiconductor integrated circuit. Therefore, according to the intermediate connector of the present configuration, it is possible to cope with a semiconductor integrated circuit having a large number of pads, with keeping a low impedance state of a power source to a high frequency region, without a need of forming vias or the like, as compared with a case where an intermediate connector is configured by a multilayer board.

It is also possible to form a capacitor with the power source bus bar, the ground bus bar, and the thin film insulator layer. This allows a configuration including a bus bar as an intermediate connector to keep a low impedance state of a power source to a high frequency region.

The intermediate connector may further include at least one of: a damping resistor that is formed on a connection face to be connected to the semiconductor integrated circuit, that is an upper end face of the power source bus bar, at positions corresponding to the plurality of power source pads, and has a sheet resistance higher than a sheet resistance of the power source bus bar; and a damping resistor that is formed on a connection face to be connected to the semiconductor integrated circuit, that is an upper end face of the ground bus bar, at positions corresponding to the plurality of ground pads, and has a sheet resistance higher than a sheet resistance of the ground bus bar.

According to the present configuration, it is possible, by a damping resistor, to suppress an impedance peak that appears in an anti-resonant frequency, and to stabilize a power source impedance of a Tr (transistor) formed inside an LSI low.

In the intermediate connector, the power source bus bar may include a plurality of types of power source bus bars having different power source voltages.

According to the present configuration, it is possible to cope with a case where a semiconductor integrated circuit needs a plurality of types of power sources having different power source voltages.

A semiconductor device disclosed in the present description may include a semiconductor integrated circuit including a pad face on which a power source pad row including a plurality of power source pads, a ground pad row including a plurality of ground pad rows, and a signal pad row including a plurality of signal pads are arranged in parallel, and the intermediate connector according to any of the above.

According to the present configuration, it is possible to provide a semiconductor device including an intermediate connector that can keep a low impedance state of a power source to a high frequency region, while coping with a semiconductor integrated circuit having a large number of pads.

A method of manufacturing an intermediate connector disclosed in the present description is a method of manufacturing an intermediate connector that is provided between a semiconductor integrated circuit and a circuit board on which the semiconductor integrated circuit is mounted, and electrically connects the semiconductor integrated circuit and the circuit board. The semiconductor integrated circuit includes a bump mounting face on which a power source pad row including a plurality of power source pads, a ground pad row including a plurality of ground pad rows, and a signal pad row including a plurality of signal pads are arranged in parallel. The method includes: a step of forming a power source bus bar in a form of an elongated thin plate that has a length of at least a length of the power source pad row, and to be connected to each of the power source pads of the power source pad row; a step of forming a ground bus bar in a form of an elongated thin plate that has a length of at least a length of the ground pad row, and is to be connected to each of the ground pads of the ground pad row; an insulator forming layer step of forming a thin film insulator layer between the power source bus bar and the ground bus bar; a step of forming a conductive path portion in a form of an elongated thin plate that has a length of at least a length of the signal pad row, and includes a plurality of conductive paths to be connected to each of the signal pads of the signal pad row; and a joining step of joining the power source bus bar, the ground bus bar, and the conductive path portion together in a parallel arrangement corresponding to the parallel arrangement of the power source pad row, the ground pad row, and the signal pad row, each of which being in a standing state such that a longitudinal direction of the thin plate is parallel to the bump mounting face of the semiconductor integrated circuit.

In the method of manufacturing an intermediate connector, the joining step may further include: a primary intermediate forming step of forming a primary intermediate for the intermediate connector that is a laminate of units, by joining the power source bus bars, the ground bus bars, and the conductive path portions that have been joined as the units; a secondary intermediate forming step of forming a plurality of secondary intermediates for the intermediate connector, by cutting the primary intermediate into a strip form corresponding to a size of the semiconductor integrated circuit; and a connector forming step of forming the intermediate connector by joining the plurality of secondary intermediates.

Advantageous Effect of the Invention

According to the intermediate connector of the present invention, it is possible to cope with a semiconductor integrated circuit having a large number of pads, with keeping a low impedance state of a power source up a high frequency region.

MODE FOR CARRYING OUT THE INVENTION

Embodiment

Figure 1:
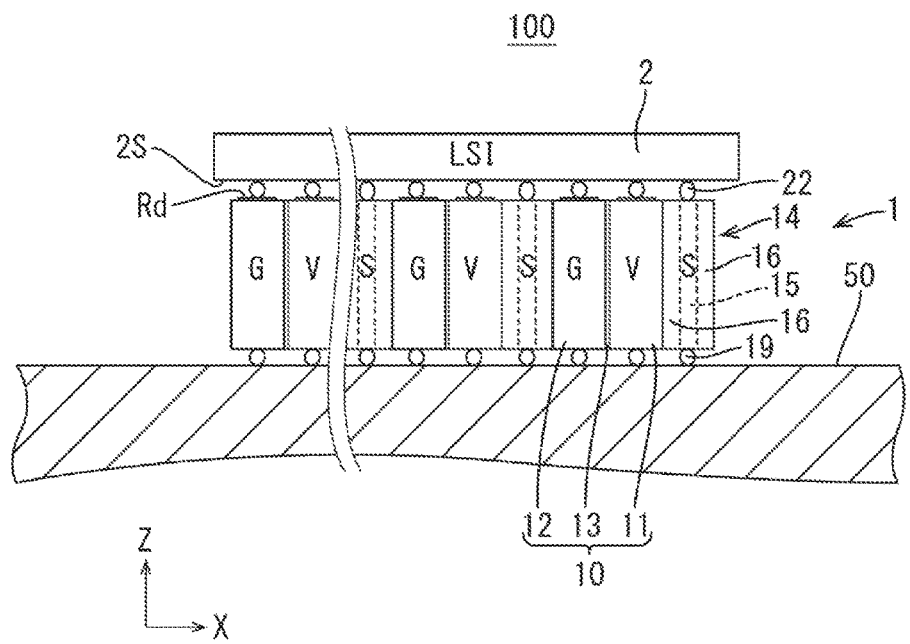
FIG. 1 is a schematic partial side view showing a semiconductor device according to the embodiment.
Figure 2:
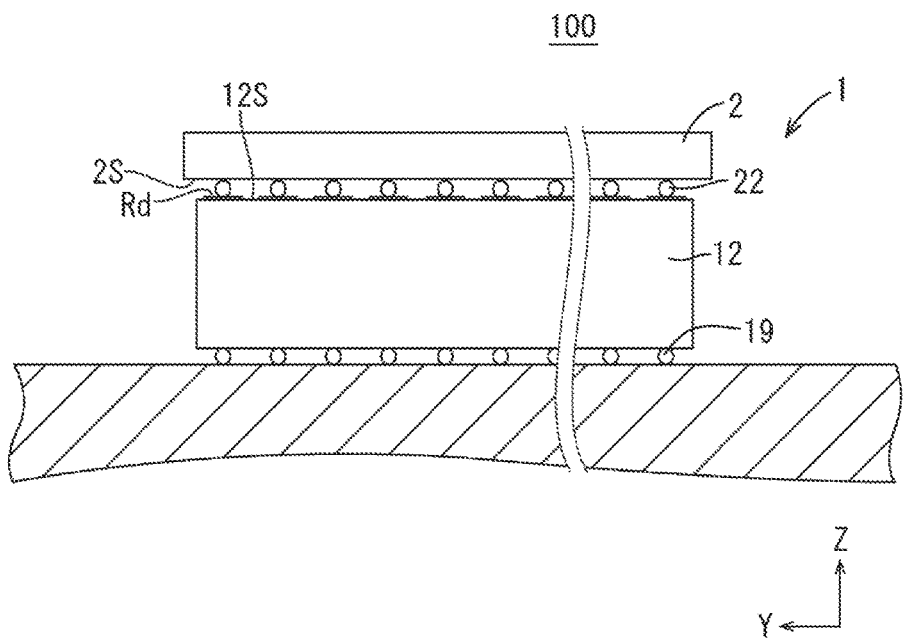
FIG. 2 is a schematic partial side view seen from the left side of FIG. 1 showing a semiconductor device.

A first embodiment will be described with reference to FIGS. 1 to 18. In the drawings, the same symbol indicates the same or corresponding part. In an identical configuration, a number of a member is sometimes omitted.

1. Configurations of Semiconductor Device

As shown in FIG. 1, a semiconductor device 100 mainly includes an intermediate connector 1 and an LSI chip (an example of a "semiconductor integrated circuit") 2. The semiconductor device 100 is mounted on a circuit board 50 such as a motherboard or the like via the intermediate connector 1. An LSI is, for example, a CPU or an MPU.

Figure 3:
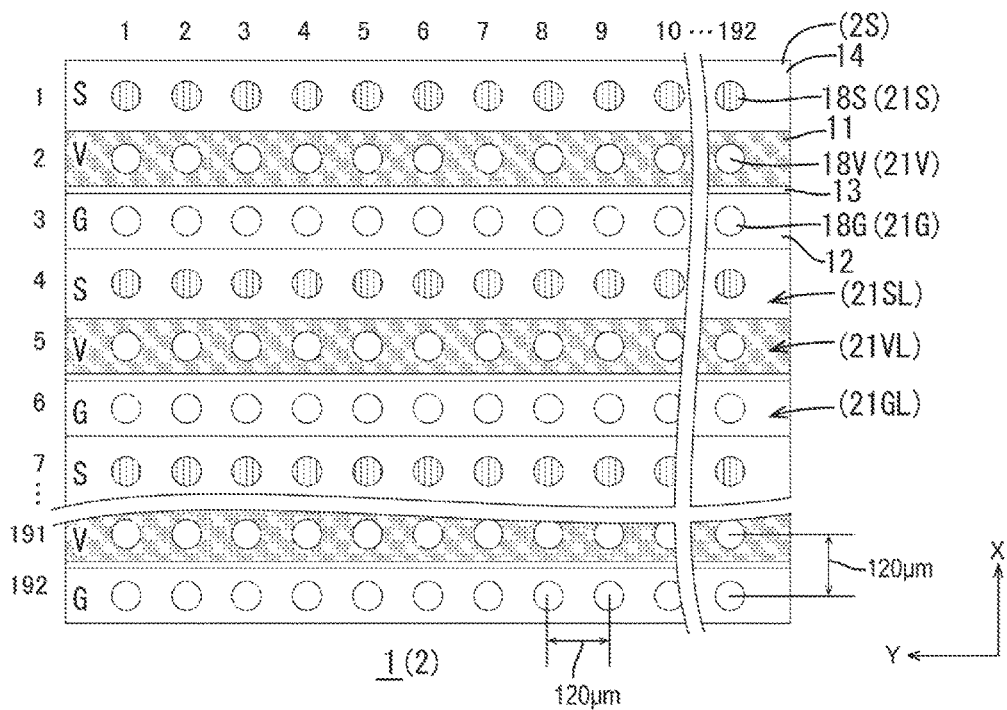
FIG. 3 is a schematic partial plan view showing an intermediate connector.

In the followings, a letter "V" added to a number of a member means a member or the like related to a positive power source voltage applied to the LSI chip 2, and a letter "G" added to a number of a member means a member or the like related to a ground voltage applied to the LSI chip 2. A letter "S" means a member or the like related to a signal input to/output from the LSI chip 2. FIG. 3 is a schematic partial plan view of the intermediate connector 1. It can also be said that FIG. 3 approximately shows a bump mounting face 2S of the LSI chip 2, for having a bump arrangement identical thereto. Therefore, FIG. 3 is also used in describing the bump mounting face 2S.

The LSI chip 2 of the present embodiment is an area array type LSI that has the bump mounting face 2S on which a power source pad row 21VL including a plurality (192 pieces, in the present embodiment) of power source pads 21V, a ground pad row 21GL including a plurality (192 pieces, in the present embodiment) of ground pads 21G, and a signal pad row 21SL including a plurality (192 pieces, in the present embodiment) of signal pads 21S are arranged in parallel, as shown in FIG. 3. As shown in FIG. 3, the total number of parallel arrangements of each pad row is 192 examples. That is, in the present embodiment, the LSI chip 2 is supposed to have the number of pads of 192×192 (36864) pieces and a chip size of approximately 23×23 mm. In the present embodiment, a pitch of the area array is set to, for example, 120 μm (micrometer).

On each of the pads 21, a bump 22 for connecting the LSI chip 2 with the intermediate connector 1, is formed (see FIG. 1, etc.). In the present embodiment, the bump 22 is, for example, an Au (gold) stud bump.

The intermediate connector 1 includes a plurality of power source bus bars 11, a plurality of ground bus bars 12, a plurality of thin film insulator layers 13, and a plurality of conductive path portions 14, as shown in FIG. 1. Each of the power source bus bars 11, each of the ground bus bars 12, and each of the thin film insulator layers 13 constitute a coupling capacitor 10. The thin film insulator layer 13 has a comparatively high relative dielectric constant as a dielectric layer of the capacitor 10. The arrow X direction in FIG. 1 and other drawings is supposed to be a width W direction of the intermediate connector 1, the arrow Y direction in FIG. 2 and other drawings is supposed to be a length L direction of the intermediate connector 1, and the arrow Z direction in FIG. 1 and other drawings is supposed to be a height H direction of the intermediate connector 1 (see FIG. 18).

A length L and a height H of the power source bus bar 11, the ground bus bar 12, and the conductive path portion 14 are equal to a length L and a height H of the intermediate connector 1. A thickness T direction of the power source bus bar 11, the ground bus bar 12, and the conductive path portion 14 is the same as the width W direction of the intermediate connector 1 (the arrow X direction) (see FIG. 18), and each thickness T (about 120 μm) is extremely smaller than the width W (about 23 mm) of the intermediate connector 1.

Each of the power source bus bars 11 has a form of an elongated thin plate, and a length of at least a length of the power source pad row 21VL of the LSI chip 2, and is connected to each of the power source pads 21V of the power source pad row 21VL.

Similarly, each of the ground bus bars 12 has a form of an elongated thin plate, and a length of at least a length of the ground pad row 21GL of the LSI chip 2, and is connected to each of the ground pads 21G of the ground pad row 21GL. The power source bus bar 11 and the ground bus bar 12 are made of a low resistance metal conductor such as a thin copper plate, and have, for example, a thickness T of approximately 120 μm, a height H of approximately 3 mm, and a length L of approximately 23 mm (see FIGS. 16 and 18). The present invention is not limited to this, and the bus bars 11 and 12 may be made of, for example, carbon or the like.

Similarly, each of the conductive path portions 14 has a form of an elongated thin plate, and a length of at least a length of the signal pad row 21SL, and includes a plurality of signal lines (conductive paths) 15 to be connected to each of the signal pads 21S of the signal pad row 21SL, and an insulator portion 16. The plurality of signal lines 15 is formed inside the insulator portion 16.

The power source bus bars 11, the ground bus bars 12, and the conductive path portions 14 are joined together in a parallel arrangement corresponding to the parallel arrangement of the power source pad row 21VL, the ground pad row 21GL, and the signal pad row 21SL of the LSI chip 2, each in a standing state such that a longitudinal direction of the thin plate (the arrow Y direction in FIG. 2) is parallel to the bump mounting face 2S of the LSI chip 2 (see FIGS. 1 to 4). That is, in the present embodiment, the power source bus bars 11, the ground bus bars 12, and the conductive path portions 14 form a plane structure in a vertical direction.

As shown in FIG. 3, a connection face 11S to be connected to the LSI chip 2, that is an upper end face of the power source bus bar 11, includes a plurality of connector side power source pads 18V corresponding to the plurality of power source pads 21V; and a connection face 12S to be connected to the LSI chip 2, that is an upper end face of the ground bus bar 12, includes a plurality of connector side ground pads 18G corresponding to the plurality of ground pads 21G.

Figure 4:
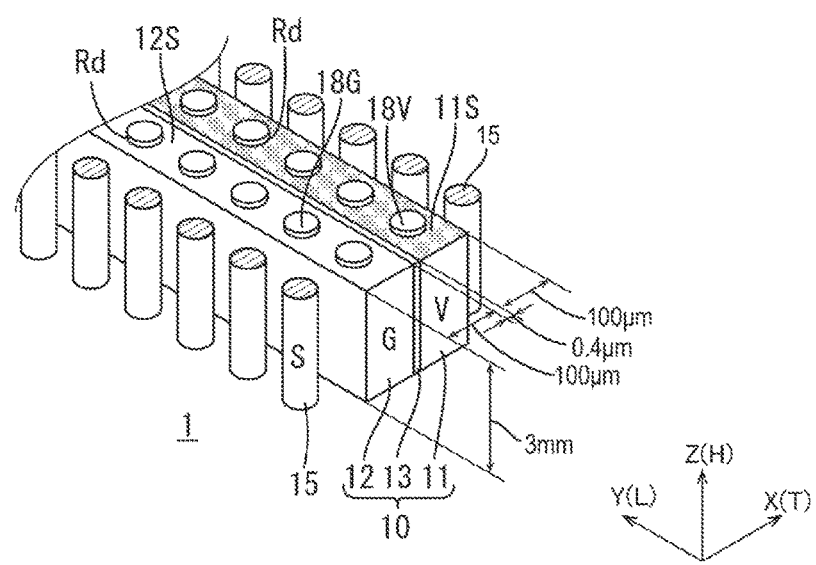
FIG. 4 is a schematic partial perspective view showing a part of an intermediate connector.

As show in FIG. 4, a damping resistor Rd having a sheet resistance higher than a sheet resistance of the power source bus bar 11 and the ground bus bar 12 is formed in a lower part of each of the connector side power source pads 18V and in a lower part of each of the connector side ground pads 18G. The damping resistor Rd has a form of a thin plate made of a metal-based high resistance material, for example. The metal-based high resistance material is, for example, TaN (tantalum nitride).

The power source bus bars 11, the ground bus bars 12, and the signal lines 15 are each connected to the circuit board 50 via a board side bump 19. The circuit board 50 is supposed to have a normal plane structure in a horizontal direction, and the signal lines 15 are fanned out through the circuit board 50.

2. Simulation of Power Source Impedance

Figure 5:
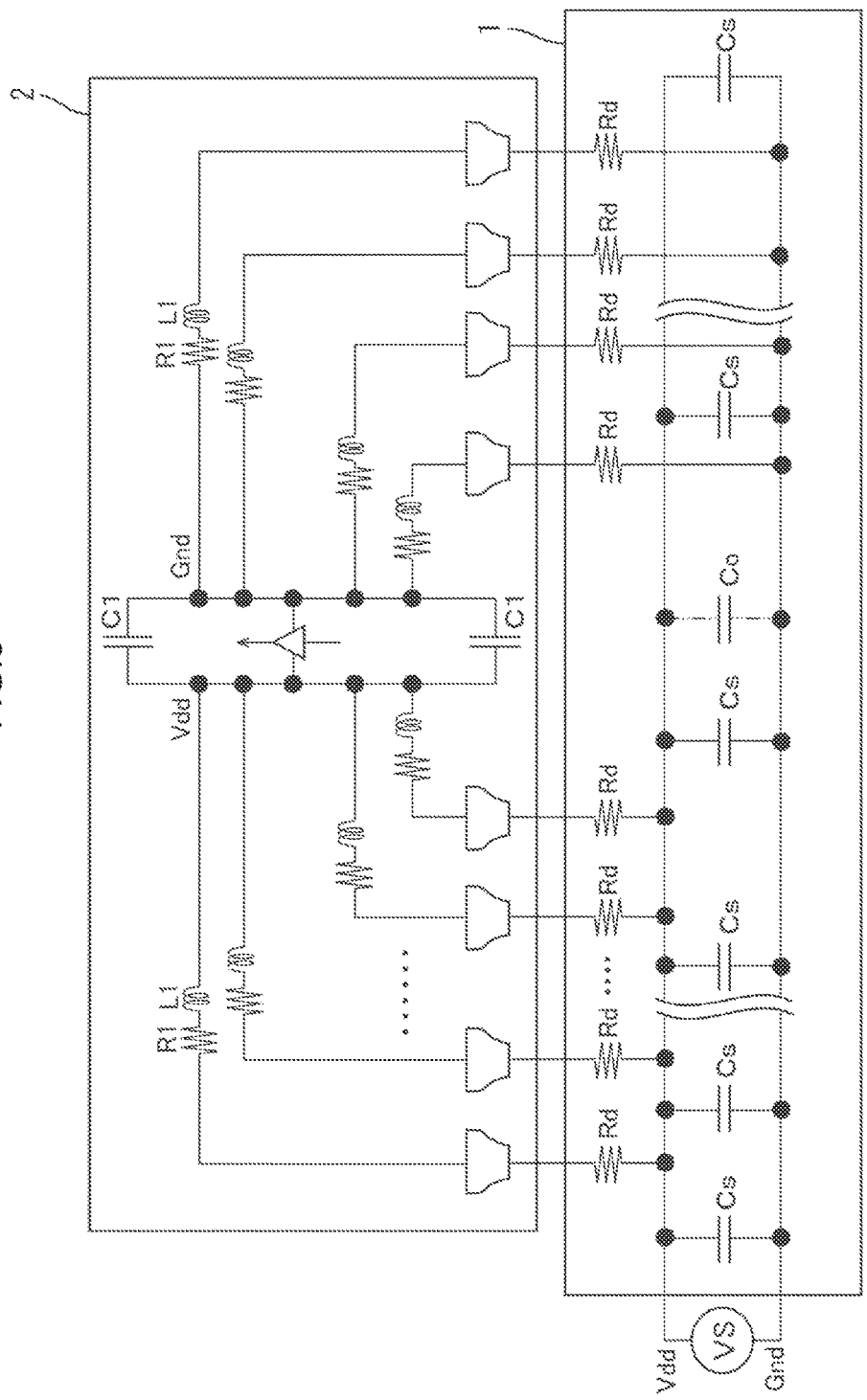
FIG. 5 is a schematic equivalent circuit diagram of a power source system of a semiconductor device.

FIG. 5 shows a schematic equivalent circuit relating to a power source impedance Zs of the LSI chip 2 that was used in the simulation.

As parameters of the equivalent circuit, at least the followings were used: a capacitance C1 between Vdd and Gnd formed in the vicinity of a transistor circuit of the LSI chip 2, a wiring resistance R1 and an inductance L1 between the transistor circuit and a pad 21 of the LSI chip 2, the damping resistor Rd, and a unit length capacitance Cs of the coupling capacitor 10.

Here, each value was set as follows: C1=90 pF, R1=5.16 mΩ, L1=0.05 nH

As for size of each of the bus bars 11 and 12, the thickness T (the length in the arrow X direction in FIG. 4) was set to 100 μm, the height H (the length in the arrow Z direction in FIG. 4) was set to 3 mm, and the length L (the length in the arrow Y direction in FIG. 4) was set to 30 mm. In FIGS. 6 to 10, the vertical axis shows a ratio of reflection in Shunt Through with dB. The level of the straight line shown around −50 dB corresponds to a power source impedance Zs of approximately 0.1Ω.

Figure 6:
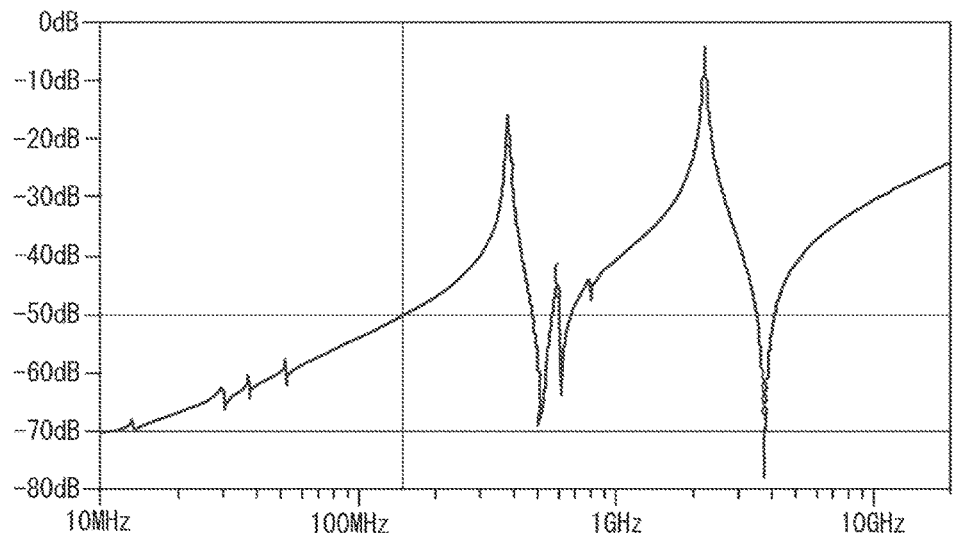
FIG. 6 is a graph showing a power source impedance characteristic according to a coupling capacitance.

FIG. 6 shows a result of a simulation of the power source impedance Zs when the damping resistor Rd was not provided and the unit length capacitance Cs was 500 pF/mm (corresponding to 75 nF in total).

Figure 7:
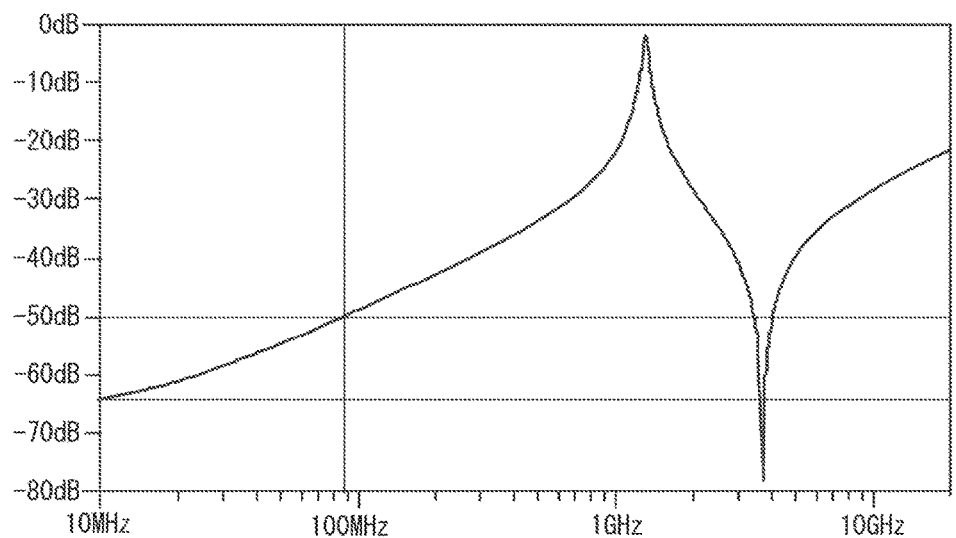
FIG. 7 is a graph showing a power source impedance characteristic according to board wiring.

FIG. 7 shows a result of a simulation of the power source impedance Zs, in a case of using a copper wiring on a printed board as a power source line, which is a normal case. The thickness T, the width W, the length L of a copper pattern in this case were set to 48 μm, 100 μm, and 30 mm respectively, and a coupling capacitor Co with a capacitance of 1 F was added directly under to the LSI chip 2.

FIGS. 6 and 7 are different in that the power source impedance Zs at 10 MHz was −70 dB and −64 dB respectively, and in FIG. 6 in which the bus bars 11 and 12 were used, a very low power source impedance Zs was provided from DC to 10 MHz. Frequencies at which the power source impedance Zs was −50 dB (0.1Ω) were 130 MHz and 80 Mz respectively, which shows that the case where the bus bars 11 and 12 were used could keep a low power source impedance Zs to a higher frequency.

In FIG. 6, an anti-resonance point appears at 400 MHz and 2 GHz, and in FIG. 7, an anti-resonance point appears at 1.2 GHz. It is considered that a coupling capacitor 10 equivalent to 75 nF formed by the bus bars 11 and 12 contributed to the anti-resonance point of 400 MHz in FIG. 6. In addition, FIG. 7 shows that even when a coupling capacitor Co with a capacitance of 1 F is added directly under the LSI chip 2, the relation "the power source impedance Zs=0.1Ω" cannot be achieved at 80 MHz or more.

Figure 8:
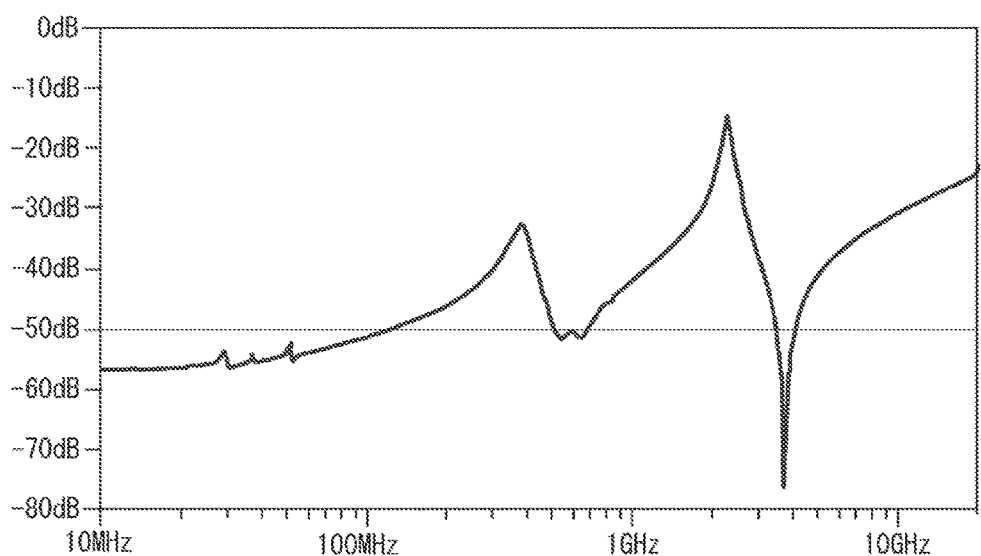
FIG. 8 is a graph showing a power source impedance characteristic according to wiring in an LSI.

FIG. 8 shows a simulation of influence of a wire (power source line) applied to the vicinity of a transistor circuit of the LSI chip 2. In this case, it is shown that when a thickness T of the power source line (copper) is 5 μm, there is a damper effect associated with the peak of an anti-resonance point at around 400 MHz (see FIG. 6).

Figure 9:
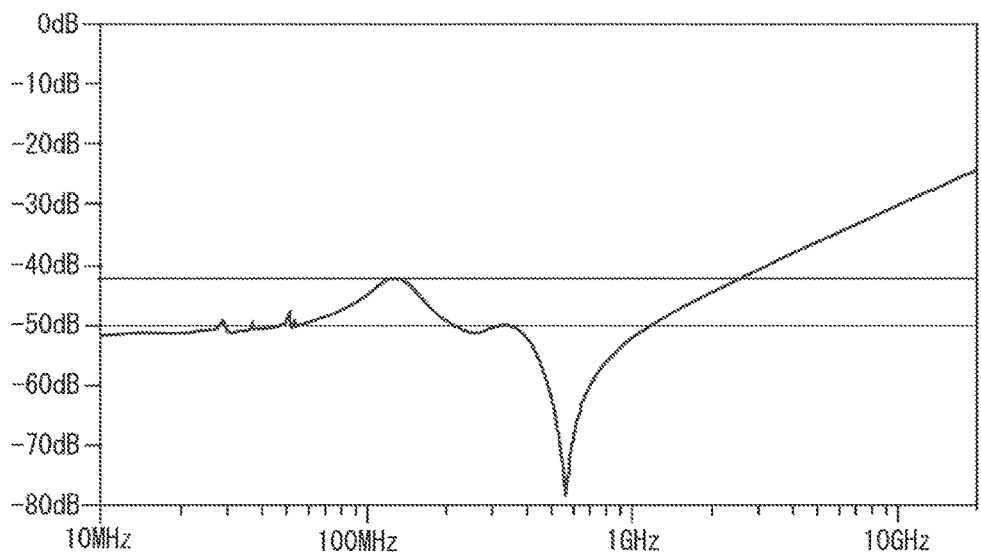
FIG. 9 is a graph showing a power source impedance characteristic according to damping resistor.

FIG. 9 shows a case where a damping resistor Rd is added between the LSI chip 2 and the bus bars 11, 12 (on each of the connection faces (the upper end faces) 11S and 12S of the bus bars 11, 12, in this embodiment). The peak of an anti-resonance point at around 100 MHz is damped by the damping resistor Rd. Conversely, it is desired that the damping resistor Rd have an optimum value in order to raise a base impedance (an impedance of a frequency close to DC). From the simulation, it has been confirmed that the optimum value of the damping resistor Rd was 0.125Ω. The simulation shows that, in this case, when the capacitance C1 in the LSI chip 2 was changed from 90 pF to 4000 pF, the anti-resonance point at around 1 GHz disappeared, and approximately −50 dB was achievable in a range from 10 MHz to 1 GHz.

Figure 10:
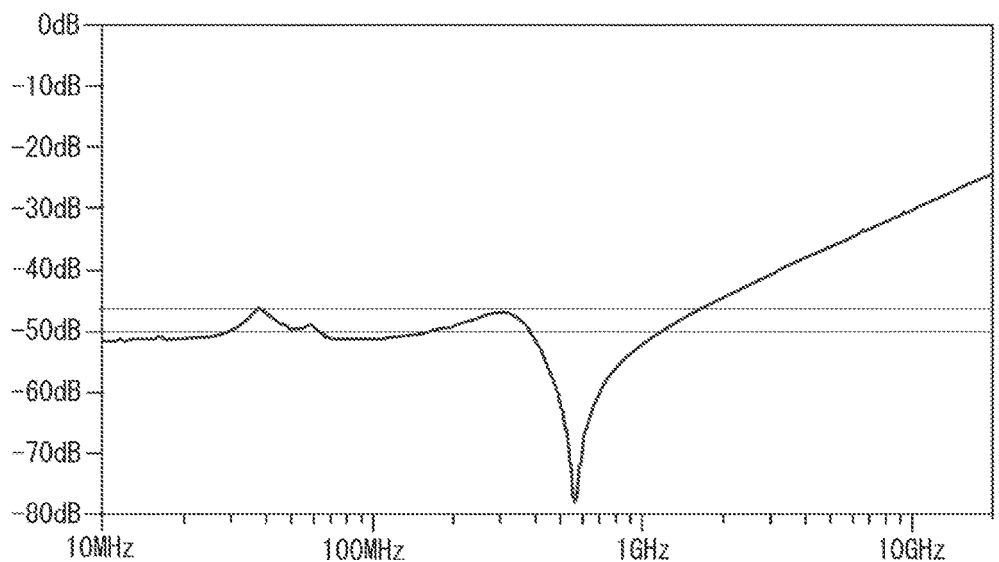
FIG. 10 is a graph showing a power source impedance characteristic when a coupling capacitance is increased.

FIG. 10 shows a case where the unit length capacitance Cs was changed from 500 pF/mm to 5000 pF/mm in a case where the damping resistor Rd of FIG. 9 was provided. It is shown that, in this case, the anti-resonance point appearing at around 100 MHz almost disappears.

3. Method of Manufacturing Intermediate Connector

Next, a method of manufacturing the intermediate connector will be described with reference to FIGS. 11 to 18.

Figure 11:
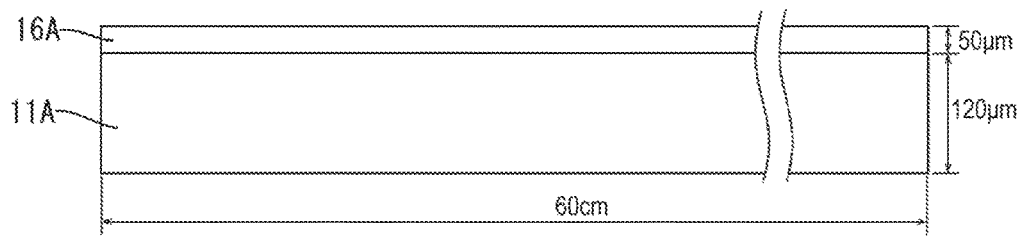
FIG. 11 is a view illustrating a method of manufacturing an intermediate connector.

First, as shown in FIG. 11, for example, an organic material 16A for forming the insulator portion 16 of the conductive path portion 14 is attached onto a copper plate 11A for forming a power source bus bar 11 (corresponding to a part of the "step of forming a power source bus bar"). The copper plate 11A has a thickness T of 120 μm, a length of several tens of centimeters, for example 60 cm, and a width (corresponding to a height H of the power source bus bar 11) of approximately 3 mm (see FIG. 16). A thickness of the organic material 16A is, for example, 50 μm. The organic material 16A is, for example, a BT (bismale-imide-triazine) resin, ABF (Ajinomoto build-up film), or the like.

Figure 12:
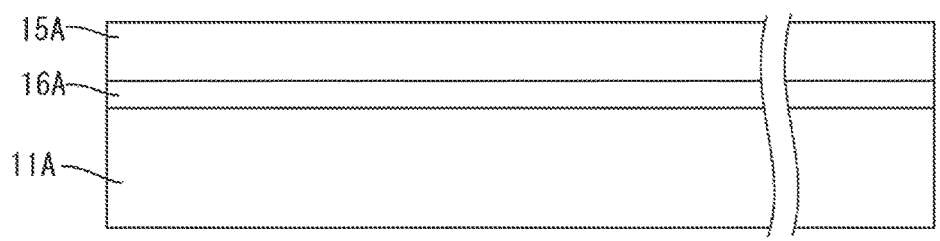
FIG. 12 is a view illustrating a method of manufacturing an intermediate connector.
Figure 13:
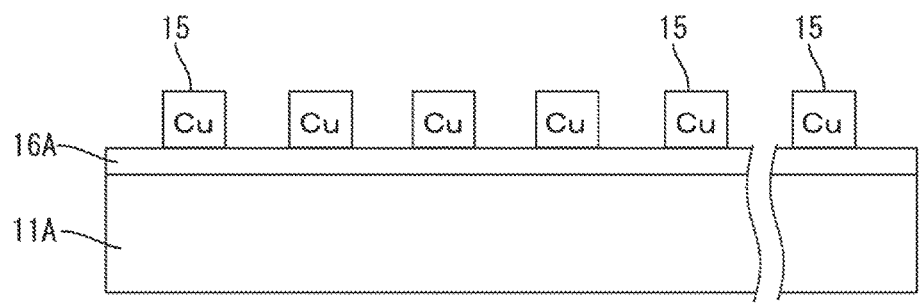
FIG. 13 is a view illustrating a method of manufacturing an intermediate connector.
Figure 14:
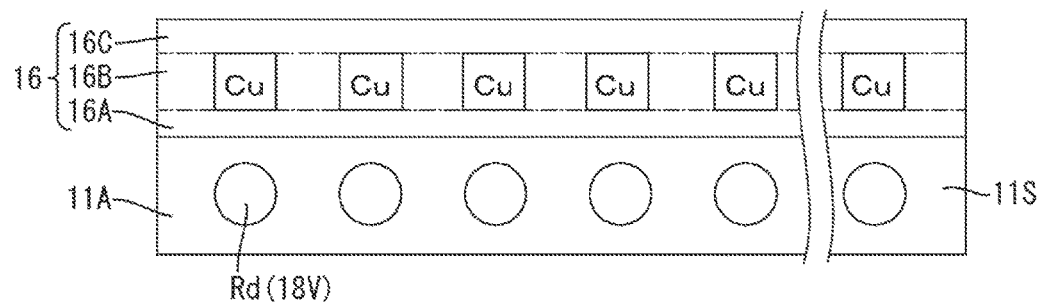
FIG. 14 is a view illustrating a method of manufacturing an intermediate connector.

Subsequently, as shown in FIG. 12, a copper plate 15A with a thickness of, for example, 50 μm, for forming the signal lines 15 is placed on the organic material 16A. Subsequently, as shown in FIG. 13, the copper plate 15A is etched to form the signal lines 15. Thereafter, as shown in FIG. 14, an etchback was done with an organic material 16B, and an organic material 16C of, for example, 50 μm is adhered thereon (corresponding to a part of the "step of forming a conductive path portion"). The conductive path portion 14 may also be produced by a normal subtractive method or a semi-additive method. Subsequently, a damping resistor Rd is formed on a face of the copper plate 11A that is a face to be an upper end face 11S of a power source bus bar 11, and a pad 18V is formed on the damping resistor Rd.

Figure 15:
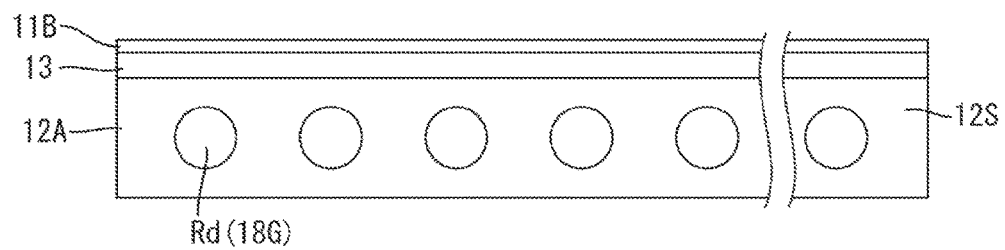
FIG. 15 is a view illustrating a method of manufacturing an intermediate connector.

On the other hand, as shown in FIG. 15, a copper plate 12A for forming the ground bus bar 12 is coated with, for example, an organic insulating material that is to be the thin film insulator layer 13 of a capacitor 10 (corresponding to a part of the "step of forming a ground bus bar" and the "step of forming an insulator layer"). The organic insulating material is desirably formed to make 1 μm or less, for example, 0.4 μm or the like, by using a spin coating or the like. As the thin film insulator layers 13, it is also possible to apply an insulating inorganic material. Subsequently, a surface of the thin film insulator layers 13 is flash-coated with a copper 11B by using a sputtering or the like. Subsequently, a damping resistor Rd is formed on a face of the copper plate 12A that is a face to be an upper face 12S of a ground bus bar 12, and a pad 18G is formed on the damping resistor Rd.

Figure 16:
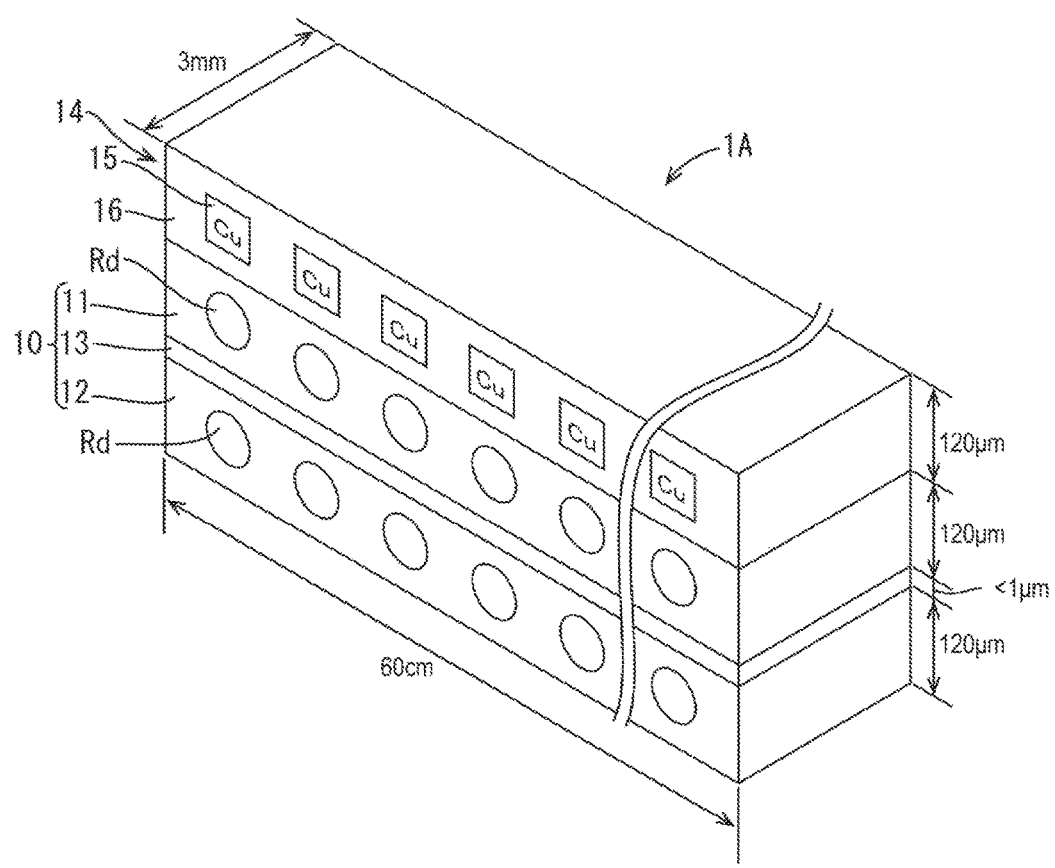
FIG. 16 is a view illustrating a method of manufacturing an intermediate connector.

Next, a surface of the copper plate 11A of FIG. 14 and a surface of the flash-coat of copper 11B of FIG. 15 are roughened. Subsequently, a surface of the copper plate 11A and a surface of the copper 11B are strongly adhered to each other by using a silane coupling agent or the like to form a unit 1A for forming an intermediate connector 1 as shown in FIG. 16 (corresponding to a part of the "joining step").

Figure 17:
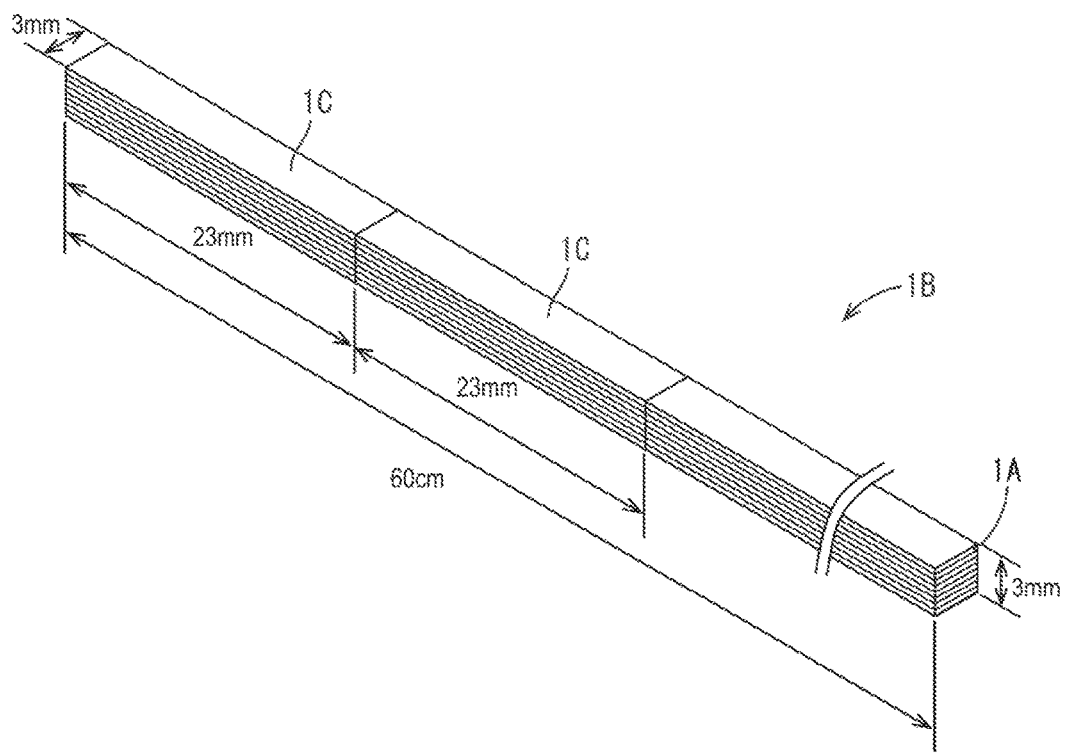
FIG. 17 is a view illustrating a method of manufacturing an intermediate connector.

Subsequently, as shown in FIG. 17, a plurality (eight, in the present embodiment) of units 1A is joined one another (multiplexed) to form a primary intermediate 1B for the intermediate connector 1, that is a laminate of the unit 1A (the primary intermediate forming step, and the joining step). The multiplexing of the unit 1A is achieved, for example, as follows. When a conductive path portion 14 is formed, the signal lines 15 are formed on a thermosetting BT resin sheet as the organic material 16A. Meanwhile, a ground bus bar 12 of the next unit 1A to be laminated is coated with a thermosetting BT resin sheet as the organic material 16C, throughout the entire face. Then, by sandwiching the signal lines 15 with the two layers of BT resin sheets and thermally curing the layers, it is possible to multiplex the unit 1A simultaneously with the formation of a conductive path portion 14. The multiplexing of the unit 1A is also possible by the same method as a method of manufacturing a normal multilayer board.

Subsequently, the primary intermediate 1B is cut into a strip form corresponding to a size of the LSI chip 2 (approximately 23 mm, in the present embodiment) by, for example, a laser, to form a plurality of secondary intermediates 1C for the intermediate connector 1 (the secondary intermediate forming step).

Figure 18:
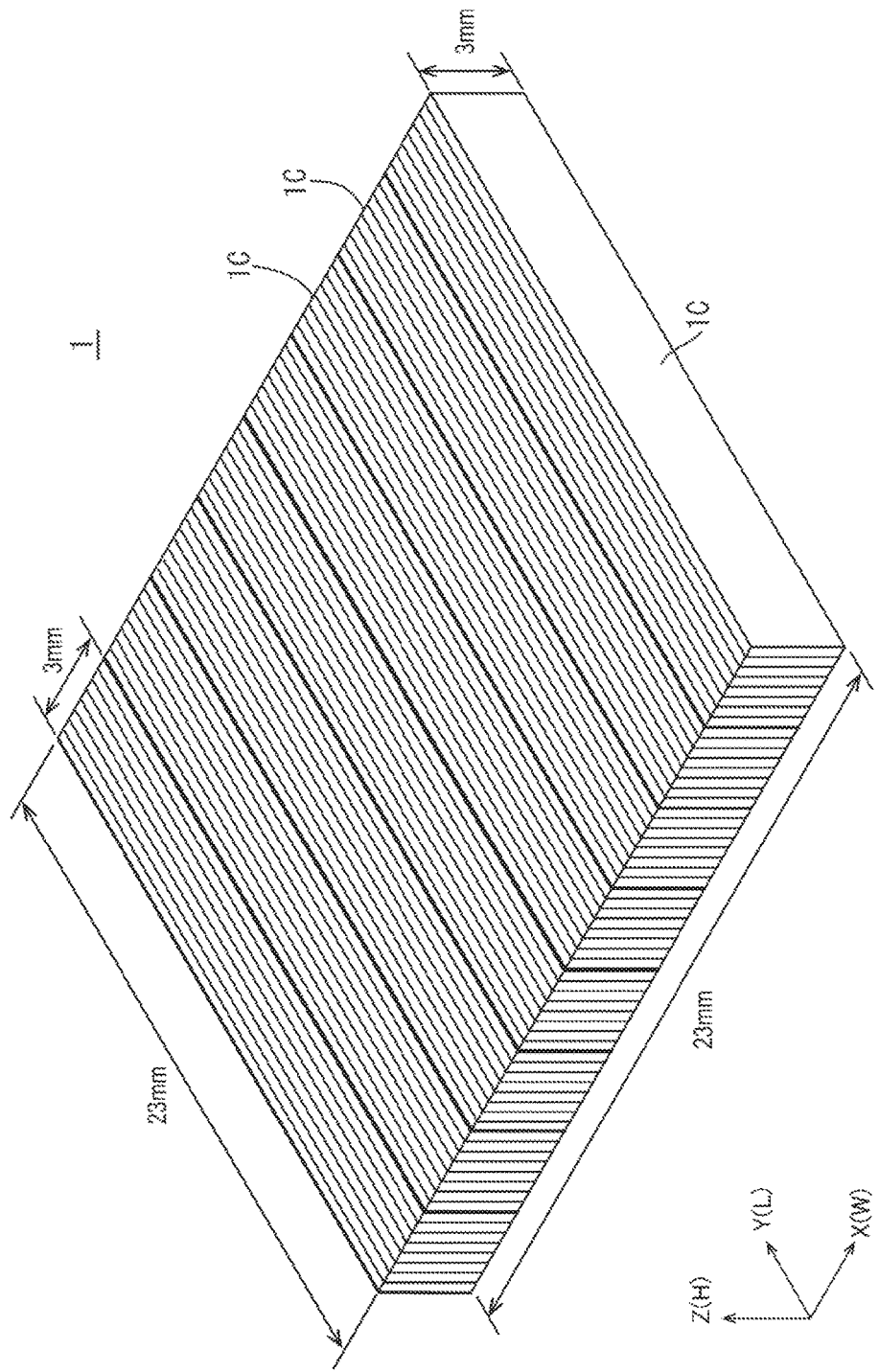
FIG. 18 is a view illustrating a method of manufacturing an intermediate connector.

Subsequently, the plurality (eight, in the present embodiment) of secondary intermediates 1C are joined to one another to form an intermediate connector 1 as shown in FIG. 18 (the connector forming step and the joining step). That is, the intermediate connector 1, in which the power source bus bars 11, the ground bus bars 12, and the conductive path portions 14 are arranged in parallel correspondingly to the parallel arrangement of the power source pad row 21VL, the ground pad row 21GL, and the signal pad row 21SL, each in a standing state such that a longitudinal direction of the thin plate (the arrow Y direction) is parallel to the bump mounting face 2S of the semiconductor integrated circuit 2, is formed.

The joining of the secondary intermediate 1C is performed, for example, similarly to the method of multiplexing the unit 1A, by using a thermosetting BT resin sheet. That is, by a BT resin sheet formed in a joining portion of two pieces of the secondary intermediates 1C, the signal lines 15 of the conductive path portion 14 of one of the two pieces of secondary intermediates 1C is sandwiched, and through a thermal curing, the other secondary intermediate 1C can be joined simultaneously with a formation of the conductive path portion 14 of one of the two pieces of secondary intermediates 1C.

4. Effects of Embodiment

Power and signals are supplied to the LSI chip 2 in which the pad rows 21GL and 21VL are arranged in parallel, by the bus bars 11 and 12 each in a form of a thin plate, and the conductive path portion 14 in a form of a thin plate. The power source bus bars 11, the ground bus bars 12, and the conductive path portions 14 are arranged in parallel correspondingly to the parallel arrangement of the pads of the LSI chip 2, each in a standing state such that a longitudinal direction of the thin plate (the arrow Y direction in FIG. 2) is parallel to the bump mounting face 2S of the LSI chip 2. That is, in the present embodiment, in other words, the intermediate connector is configured to have a plane structure in a vertical direction. Therefore, according to the intermediate connector 1 of the present configuration, it is possible to cope with a semiconductor integrated circuit having a large number of pads, with keeping a low impedance state of a power source to a high frequency region, without a need of forming vias or the like, as compared with a conventional intermediate connector configured by a multilayer board having a plane structure in a horizontal direction.

In addition, between a power source bus bar 11 and a ground bus bar 12, a thin film insulator layer 13 is provided. Therefore, it is possible to form a capacitor 10 with a power source bus bar 11, a ground bus bar 12, and a thin film insulator layer 13. This allows keeping a power source impedance low to a high frequency region, in a configuration including the bus bars 11 and 12 as an intermediate connector 1.

Moreover, it is possible to improve a power source impedance characteristic of the intermediate connector 1, by the damping resistor Rd.

Other Embodiments

The present invention is not limited to the embodiment as described by the above descriptions and the drawings, but, for example, embodiments as follows are also involved in the technical scope of the present invention.

(1) Although the embodiment above exemplifies a configuration in which a damping resistor Rd is formed on the connection face (upper end face) 11S of the power source bus bar 11 and on the connection face (upper end face) 12S of the ground bus bar 12, the present invention is not limited thereto. For example, the damping resistor Rd may be formed only on the connection face (upper end face) 11S of the power source bus bar 11, or only on the connection face (upper end face) 12S of the ground bus bar 12. Moreover, the damping resistor Rd may be omitted.

(2) The power source bus bar may include a plurality of types of power source bus bars having different power source voltages. In this case, it is possible to cope with a case where an LSI chip 2 requires a plurality of types of power source bus bars having different power source voltages (such as 3 V (volt) and 1 V). At that time, for example, it is possible to configure such that a single unit 1A includes the plurality of types of power source bus bars having different power source voltages, and it is also possible to configure such that power source voltages are different by each unit 1A.

(3) The power source bus bar 11, the ground bus bar 12, and the conductive path portion 14 are arranged in parallel in an arbitrary order. That is, the order may be appropriately changed so as to correspond to a parallel arrangement of a power source pad row, a ground pad row, and a signal pad row of an LSI chip 2. For example, the order of parallel arrangement may be such that a conductive path portion 14, a ground bus bar 12, a power source bus bar 11, or may be a conductive path portion 14, a power source bus bar 11, a power source bus bar 11, a ground bus bar 12, a ground bus bar 12.

(4) The above embodiment exemplifies a configuration in which a chip size of the LSI chip 2 is set to approximately 23×23 mm, the number of pads is 192×192 (36864) pieces, and a pad pitch is 120 μm, and in which an intermediate connector 1 corresponding to the pads of the LSI chip 2. However, the present invention is not limited thereto. That is, the intermediate connector of the present application can also be applied to an LSI chip with other optional chip sizes, numbers of pads, and pad pitches.

EXPLANATION OF SYMBOLS

1: Intermediate connector
1A: Unit
1B: Primary intermediate body
1C: Secondary intermediate body
2: LSI chip (Semiconductor integrated circuit)
2S: Bump mounting face
10: Coupling capacitor
11: Power source bus bar
11S: Upper end face (connection face) of power source bus bar
12: Ground bus bar
12S: Upper end face (connection face) of ground bus bar
13: Thin film insulator layer
14: Conductive path portion
15: Signal line (Conductive path)
21G: Ground pad
21GL: Ground pad row
21S: Signal pad
21SL: Signal pad row
21V: Power source pad
21VL: Power source pad row 100: Semiconductor device
Rd: Damping resistor

The invention claimed is:

1. An intermediate connector that is provided between a semiconductor integrated circuit and a circuit board on which the semiconductor integrated circuit is mounted, and electrically connects the semiconductor integrated circuit and the circuit board, the semiconductor integrated circuit including a bump mounting face on which a power source pad row including a plurality of power source pads, a ground pad row including a plurality of ground pads, and a signal pad row including a plurality of signal pads are arranged in parallel, the intermediate connector comprising:
a power source bus bar in a form of an elongated thin plate that has a length of at least a length of the power source pad row, and is to be connected to each of the power source pads of the power source pad row;
a ground bus bar in a form of an elongated thin plate that has a length of at least a length of the ground pad row, and is to be connected to each of the ground pads of the ground pad row;
a thin film insulator layer that is formed between the power source bus bar and the ground bus bar; and
a conductive path portion in a form of an elongated thin plate that has a length of at least a length of the signal pad row, and includes a plurality of conductive paths to be connected to each of the signal pads of the signal pad row,
wherein the power source bus bar, the ground bus bar, and the conductive path portion are joined together in a parallel arrangement corresponding to the parallel arrangement of the power source pad row, the ground pad row, and the signal pad row, each of which being in a standing state such that a longitudinal direction of the thin plate is parallel to the bump mounting face of the semiconductor integrated circuit.

2. The intermediate connector according to claim 1, further comprising at least one of:
a damping resistor that is formed on a connection face to be connected to the semiconductor integrated circuit, that is an upper end face of the power source bus bar, at positions corresponding to the plurality of power source pads, and has a sheet resistance higher than a sheet resistance of the power source bus bar; and
a damping resistor that is formed on a connection face to be connected to the semiconductor integrated circuit, that is an upper end face of the ground bus bar, at positions corresponding to the plurality of ground pads, and has a sheet resistance higher than a sheet resistance of the ground bus bar.

3. The intermediate connector according to claim 1, wherein the power source bus bar includes a plurality of types of power source bus bars having different power source voltages.

4. A semiconductor device comprising:
a semiconductor integrated circuit including a pad face on which a power source pad row including a plurality of power source pads, a ground pad row including a plurality of ground pad rows, and a signal pad row including a plurality of signal pads are arranged in parallel; and
the intermediate connector according to claim 1.

5. A method of manufacturing an intermediate connector that is provided between a semiconductor integrated circuit and a circuit board on which the semiconductor integrated circuit is mounted, and electrically connects the semiconductor integrated circuit and the circuit board, the semiconductor integrated circuit including a bump mounting face on which a power source pad row including a plurality of power source pads, a ground pad row including a plurality of ground pad rows, and a signal pad row including a plurality of signal pads are arranged in parallel, the method comprising:
a step of forming a power source bus bar in a form of an elongated thin plate that has a length of at least a length of the power source pad row, and to be connected to each of the power source pads of the power source pad row;
a step of forming a ground bus bar in a form of an elongated thin plate that has a length of at least a length of the ground pad row, and is to be connected to each of the ground pads of the ground pad row;
a step of forming an insulator layer between the power source bus bar and the ground bus bar;
a step of forming a conductive path portion in a form of an elongated thin plate that has a length of at least a length of the signal pad row, and includes a plurality of conductive paths to be connected to each of the signal pads of the signal pad row; and
a joining step of joining the power source bus bar, the ground bus bar, and the conductive path portion together in a parallel arrangement corresponding to the parallel arrangement of the power source pad row, the ground pad row, and the signal pad row, each of which being in a standing state such that a longitudinal direction of the thin plate is parallel to the bump mounting face of the semiconductor integrated circuit.

6. The method of manufacturing an intermediate connector according to claim 5, wherein the joining step further includes:
a primary intermediate forming step of forming a primary intermediate for the intermediate connector that is a laminate of units, by joining the power source bus bars, the ground bus bars, and the conductive path portions that have been joined as the units;
a secondary intermediate forming step of forming a plurality of secondary intermediates for the intermediate connector, by cutting the primary intermediate into a strip form corresponding to a size of the semiconductor integrated circuit; and
a connector forming step of forming the intermediate connector by joining the plurality of secondary intermediates.

* * * * *